(12) United States Patent
Tseng

(10) Patent No.: US 8,234,530 B2
(45) Date of Patent: *Jul. 31, 2012

(54) SERIAL INTERFACE DEVICE BUILT-IN SELF TEST

(75) Inventor: Wayne Tseng, Taipei Hsien (TW)

(73) Assignee: Via Technologies Inc., Taipei Hsien (TW)

( * ) Notice: Subject to any disclaimer, the term of this patent is extended or adjusted under 35 U.S.C. 154(b) by 14 days.

This patent is subject to a terminal disclaimer.

(21) Appl. No.: 13/110,235

(22) Filed: May 18, 2011

(65) Prior Publication Data

US 2011/0225470 A1 Sep. 15, 2011

Related U.S. Application Data

(63) Continuation of application No. 12/346,800, filed on Dec. 30, 2008, which is a continuation-in-part of application No. 11/162,153, filed on Aug. 30, 2005, now Pat. No. 7,490,278.

(60) Provisional application No. 60/522,812, filed on Nov. 9, 2004.

(51) Int. Cl.
| | |
|---|---|
| G06F 11/00 | (2006.01) |
| G06F 7/02 | (2006.01) |
| G01R 31/28 | (2006.01) |
| G01R 31/30 | (2006.01) |
| H03M 13/00 | (2006.01) |

(52) U.S. Cl. ........ 714/733; 714/30; 714/705; 714/716; 714/717; 714/734; 714/739; 714/745; 714/706; 714/820

(58) Field of Classification Search .................. None
See application file for complete search history.

(56) References Cited

U.S. PATENT DOCUMENTS

| | | | |
|---|---|---|---|
| 5,574,731 | A | 11/1996 | Qureshi |
| 6,574,758 | B1 | 6/2003 | Eccles |
| 6,622,273 | B1 | 9/2003 | Barnes |
| 7,062,688 | B2 | 6/2006 | Gauthier |
| 7,444,558 | B2 | 10/2008 | Mitbander et al. |
| 7,464,307 | B2 | 12/2008 | Nejedlo et al. |
| 2004/0044938 | A1 | 3/2004 | Heo |
| 2005/0229249 | A1 | 10/2005 | Piwonka et al. |
| 2010/0275037 | A1 | 10/2010 | Lee et al. |

OTHER PUBLICATIONS

Intel Corporation, PHY Interface for the PCI Express Architecture, Jun. 19, 2003, version 1.0, pp. 1-31.
Altera, 8B10B Encoder/Decoder MegaCore Function User Guide, May 2011, Version 11.0, pp. 1-32.

*Primary Examiner* — Guerrier Merant
(74) *Attorney, Agent, or Firm* — Thomas, Kayden, Horstemeyer & Risley, LLP

(57) ABSTRACT

A built-in self test circuit includes a pattern generator, an elastic buffer, a symbol detector, and a comparison unit. A pattern generator generates a first test pattern to test a port under test and then a result pattern is gotten and stored in the elastic buffer. The symbol detector detects if a starting symbol exists in the test result pattern. If it exists, a second test pattern is generated to be compared with the test result pattern. As a result, a reliability of data transmission of the port under test is determined.

20 Claims, 4 Drawing Sheets

SERIAL INTERFACE DEVICE BUILT-IN SELF TEST

CROSS REFERENCE TO RELATED APPLICATIONS

This application is a continuation of U.S. application Ser. No. 12/346,800, filed Dec. 30, 2008, which is a continuation-in-part of U.S. application Ser. No. 11/162,153, filed Aug. 30, 2005, now issued as U.S. Pat. No. 7,490,278, both of which are incorporated herein by reference, and U.S. application Ser. No. 11/162,153 claims the benefit of U.S. Provisional Application No. 60/522,812 filed Nov. 9, 2004.

BACKGROUND OF THE INVENTION

1. Field of the Invention

The present invention relates to a built-in test circuit, more particularly a serial interface device built-in test circuit capable of detecting command symbols to automatically compensate loopback latency.

2. Description of the Prior Art

In the development of personal computer systems and peripheral devices, bandwidth and speed requirements of the interconnect interface are increasing. Loads of conventional parallel interfaces are insufficient. Therefore, serial interfaces, such as PCI Express interface, USB 3.0 interface and SATA interface are widely used in today's computer system for satisfying such high bandwidth demands. For example, the first generation PCI Express provides at least 2.5 Gbps for each lane; USB 3.0 offers at least 5.0 Gbps for each port; and SATA has at least 1.5 Gbps capacity for each port. Those serial interfaces utilize higher operational clocks and apply more data lanes/ports to improve data transmission efficiency, which greatly enhance performance of computer systems.

Serial interface devices, USB 3.0 devices for instance, coupled to a serial bus, a USB 3.0 bus for instance, are usually operated at a high-speed transmission where data volume is large. In order to make sure of the accuracy of data transmission, a conventional built-in self test (BIST) circuit is used to test the serial interface device. A test pattern generator (TPG) and an output response analysis (ORA) are built-in to a port under test. Please refer to FIG. 1. FIG. 1 illustrates architecture of a conventional built-in self test circuit 100. The built-in self test circuit 100 includes a pattern generator 102, an elastic buffer 104, a pattern register 106, a pattern comparison module 108, and a port under test 110. The pattern generator 102 generates a test pattern to the port under test 110 and the pattern register 106, then the elastic buffer 104 receives and transmits the test patterns via the port under test 110 to the pattern comparison module 108, and the pattern register 106 temporarily stores and transmits the test patterns in a predetermined time to the pattern comparison module 108. The test pattern received by the elastic buffer 104 and the test pattern stored in the pattern register 106 are compared; the pattern comparison module 108 determines whether the port under test 110 correctly transmits the test pattern generated by the pattern generator 102.

The conventional built-in self test circuit 100 does not require an external automatic test equipment (ATE) to generate a test vector, also it is not required by the ATE to analyze test results. Therefore the test bandwidth requirement is less than general test methods, and test speed is not limited by the ATE speed hence it is more efficient. However, the port under test 110 of serial interface device such as a USB 3.0 device includes a plurality of loopback paths, which also means that time required by the test patterns to pass through the port under test 110 is not constant, so that the loopback latency cannot be predicted. Therefore the storage capacity of the pattern register 106 must be sufficiently large to compensate the loopback latency. Furthermore, the built-in self test circuit 100 will be affected by phase jitter which causes errors in the pattern comparison module 108. Moreover, the storage capacity of the pattern register 106 must be restricted; therefore when the loopback latency becomes too great, the built-in self test architecture 100 will not operate accurately.

SUMMARY OF THE INVENTION

The claimed invention provides a serial interface device built-in test circuit for compensating loopback latency.

The claimed invention provides a serial interface device built-in self test circuit includes: a pattern generator coupled to a port under test for generating a first test pattern to test a port under test; an elastic buffer coupled to the port under test for receiving a test result pattern from the port under test, wherein the test result pattern is gotten according to the first test pattern; a symbol detector coupled to the elastic buffer for detecting whether a starting symbol is found in the test result pattern; wherein a second test pattern which is substantially identical to the first test pattern is generated while the starting symbol is detected; and a comparison unit for comparing the test result pattern and the second test pattern.

The claimed invention further provides a self test method for testing a serial interface device, the method includes: utilizing a first test pattern to test a port under test to get a test result pattern according to the first test pattern; detecting whether a starting symbol is in the test result pattern; generating a second test pattern while the starting symbol is detected, wherein second test pattern is substantially identical to the first test pattern; and comparing the test result pattern and the second test pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
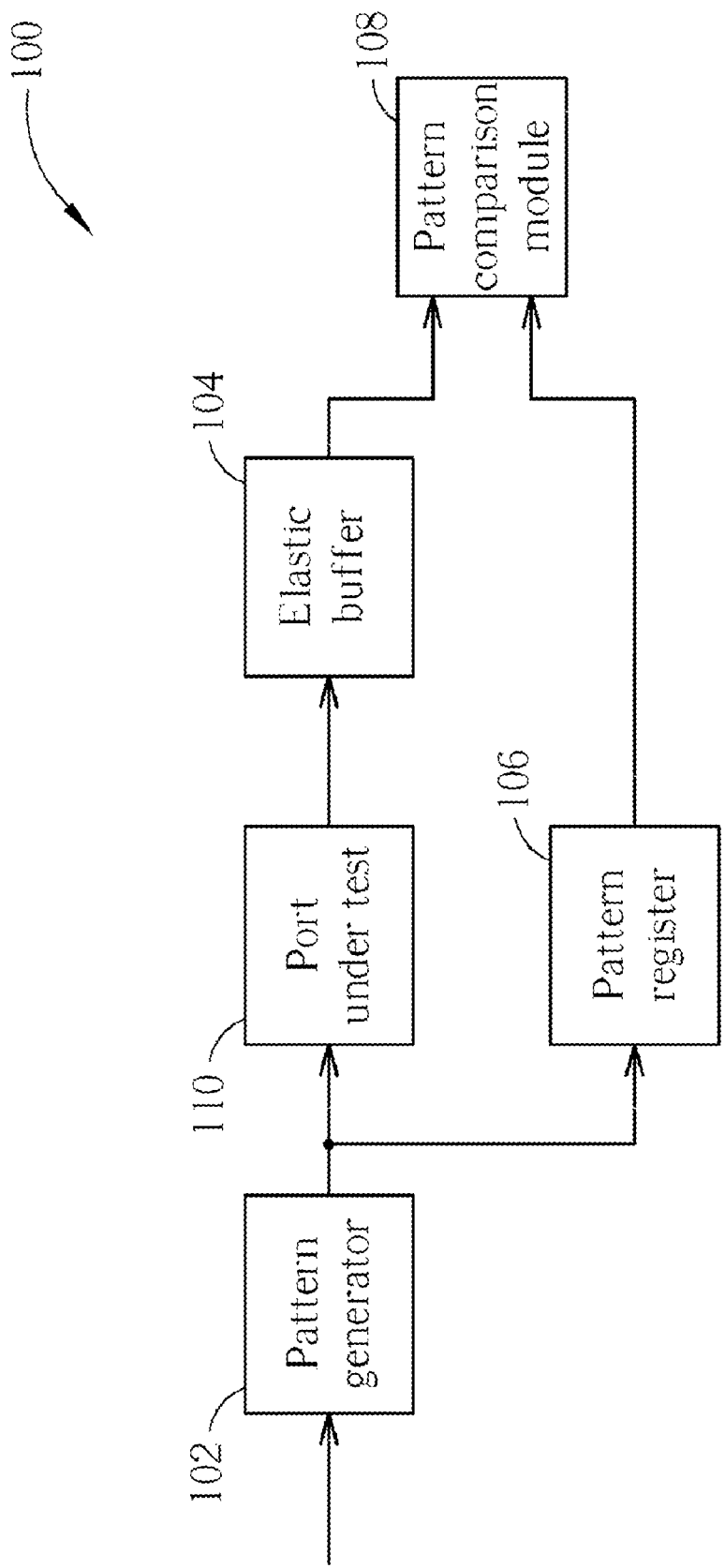
FIG. 1 illustrates a conventional built-in self test circuit.
Figure 2:
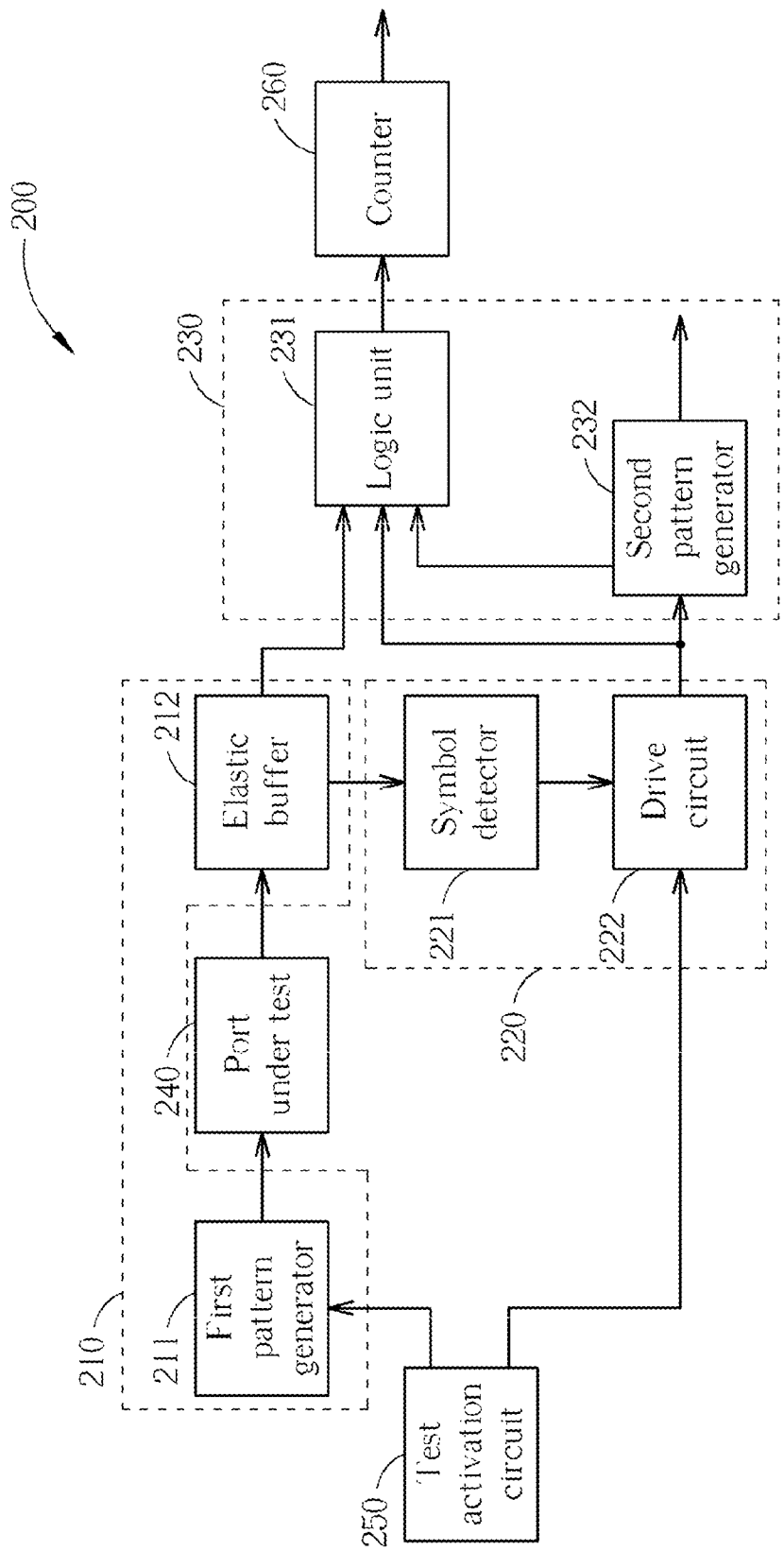
FIG. 2 illustrates one embodiment of a serial interface device built-in test circuit of the present invention.

Please refer to FIG. 2. FIG. 2 illustrates one embodiment of a serial interface device built-in test circuit 200 of the invention. The built-in test circuit 200 is capable of compensating loopback latency of serial interface devices such as PCI Express devices, USB 3.0 devices and SATA devices. The built-in test circuit 200 includes a test unit 210, a detecting unit 220, and a compare unit 230. The test unit 210 includes a first pattern generator 211 and an elastic buffer 212. The detecting unit 220 includes a symbol detector 221 and a drive circuit 222. The compare unit 230 includes a second pattern generator 232 and a logic unit 231. Furthermore, the built-in self test circuit 200 further includes a test activation circuit 250 and a counter 260. In FIG. 2, a port under test 240 is a port in the serial interface device required to be tested.

Those skilled in the art should understand sometimes the term "port" and the term "lane" are alternatively used, and they are essentially the same. For example, while USB 3.0 devices or SATA devices are indicated, the term "port" is more often used than the term "lane"; however, while PCI Express devices are specified, the term "lane" is used instead. The method of operating the built-in self test circuit 200 will be explained in the following paragraph.

For a serial data transmission, there is a symbol in each data sequence to indicate the beginning of the data sequence. For example, the starting symbol could be a COM symbol. In one embodiment of the invention, assume a USB 3.0 device is going to be tested. The first pattern generator 211 generates a first test pattern to test a port under test 240. Then, a test result pattern is gotten and stored in the elastic buffer 212. The symbol detector 221 detects whether a starting symbol COM is found in the test result pattern. If there is a starting symbol in the test result pattern, then the second pattern generator 232 generates a second test pattern. In the invention, the second test pattern is substantially identical to the first test pattern. The logic unit 231 compares the test result pattern and the second test pattern to determine if the port under test 240 carries data accurately. In the embodiment, the test activation circuit 250 is active while a test is performed; and the first pattern generator is controlled by the test activation circuit 250. Additionally, the drive circuit 222 is used to drive the second pattern generator 232 to generate the second test pattern.

In the present invention, no matter how many latencies the port under test 240 has, the second test pattern is only generated while the starting symbol COM is detected within the test result pattern. By comparing the test result pattern and the second test pattern, the logic unit 231 can determine whether the first test pattern transmitted by the port under test 240 is accurate.

Because there are many loopback paths in the port under test 240, spending time for the test patterns to pass through the port under test 240 is uncertain. As a result, it is impossible to estimate the loopback latency. However, by detecting the starting symbol COM, it is not necessary to consider the issue of latency. Furthermore, the counter 260 counts clock differences between the second test pattern and the test result pattern within a predetermined time period. Hence, bit error rate (BER) can be figured out via an error rate detection circuit (not shown in FIG. 2). Besides, the first pattern generator 211 and the second pattern generator 232 could further couple to a test pattern selector (also not shown in FIG. 2) for selecting various types of test patterns to execute different tests.

Figure 3:
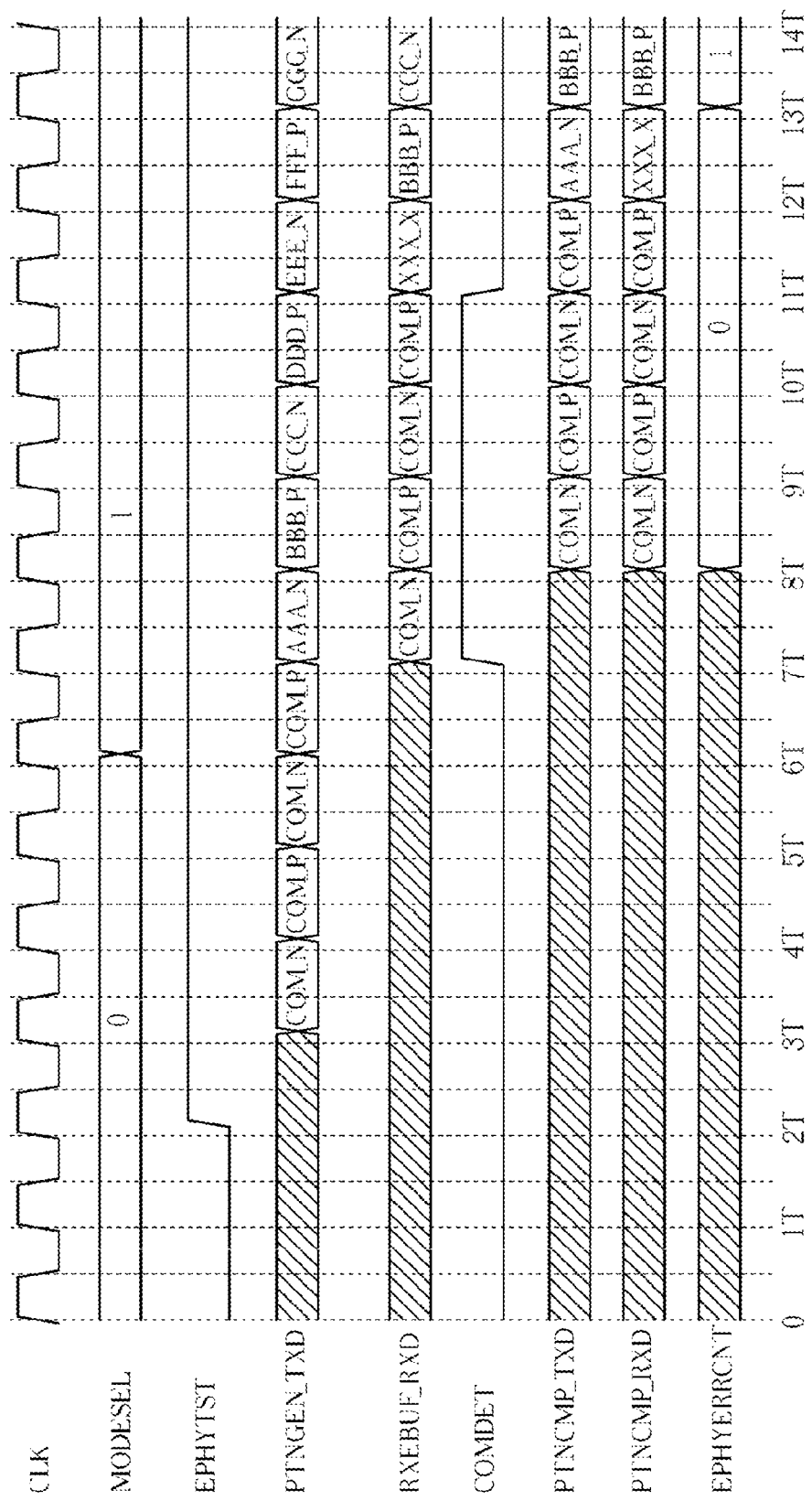
FIG. 3 illustrates a waveform diagram of serial interface device built-in self test circuit of FIG. 2.

Please refer to FIG. 2 and FIG. 3. FIG. 3 illustrates a waveform diagram of built-in self test circuit 200 of FIG. 2. In FIG. 3, Signal CLK represents system clock, and each cycle is T. Signal MODELSEL represents signals outputted from the test pattern selector for selecting test patterns outputted from the first pattern generator 211 and the second pattern generator 232. Signal EPHYTST represents signals outputted from the test activation circuit 250. In one embodiment of the invention, built-in self test circuit 200 would start to test while the signal EPHYTST is asserted, Signal PTNGEN_TXD represents signals outputted from the first pattern generator 211; and signal RXEBUF_RXD represents signal received by the elastic buffer 212. Signal COMDET represents signals outputted from the symbol detector 221. In one embodiment of the present invention, the symbol detector 221 asserts the signal COMDET while a starting symbol is detected. Signal PTNCMP_TXD represents signals generated by the second pattern generator 232. Signal PTNCMP_RXD is received by the logic unit 231. Signal EPHYERRCNT represents signals outputted from the counter 260.

As shown in FIG. 3, while the signal EPHYTST transitions from low to high level state at 2T, a test is triggered. Then the first pattern generator 211 outputs a first test pattern at 3T which leads four COM symbols. More detail, COM_N means the COM symbol in a negative running disparity status; and COM_P means the COM symbol in a positive running disparity status. At 6T, the signal MODESEL transitions from 0 to 1, other symbols, following the four COM symbols, are generated. That is to say, symbols AAA_N, BBB_P, CCC_N and so forth are sequentially transmitted from 7T. Assume latency of the port under test 240 is four cycles; as a result, a test result pattern is gotten from the port under test 240 at 7T. The test result pattern is restored in the elastic buffer 212. As mentioned above, the signal COMDET is asserted at a high level state from 7T to 10T due to the first four COM symbols of the result pattern (i.e. signal RXEBUF_RXD) are detected. Then, the second pattern generator 232 accordingly generates a second test pattern at 8T. In one embodiment of the invention, the second test pattern is substantially identical to the first test pattern. If the port under test 240 is functional well, the result pattern should be the same with the originally inputted pattern—the first test pattern. However, if the port under test 240 is unable to correctly transmit, an error symbols may be found in the result pattern. For example, assume the fifth symbol AAA_N of the first test pattern is replaced by an error symbol XXX_X in the result pattern, by comparing the second test pattern (i.e. signal PTNCMP_TXD) and the result pattern (i.e. signal PTNCMP_RXD), the incorrect transmission is identified. Then, 1 is accumulated by the counter 260 to indicate one different symbol is found between signals PTNCMP_TXD and PTNCMP_RXD.

Figure 4:
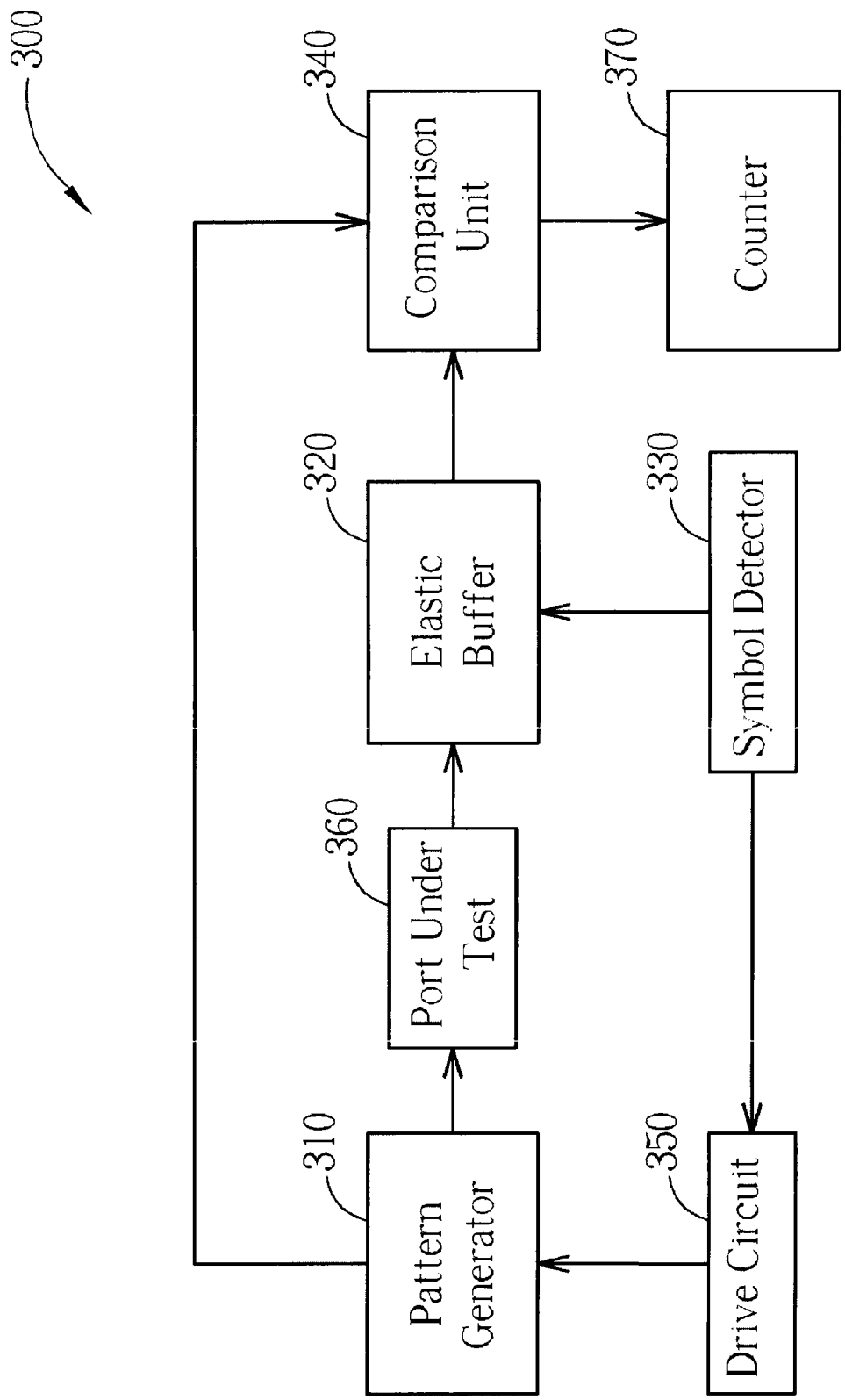
FIG. 4 illustrates another one embodiment of a serial interface device built-in test circuit of the present invention.

FIG. 4 illustrates another embodiment of serial interface device built-in test circuit 300 of the invention. The built-in test circuit 300 is capable of compensating loopback latency of serial interface devices such as PCI Express devices, USB 3.0 devices and SATA devices. The built-in test circuit 300 includes a pattern generator 310, an elastic buffer 320, a symbol detector 330, and a comparison unit 340. Furthermore, the built-in self test circuit 300 further includes a drive circuit 350 and a counter 370. In FIG. 4, a port under test 360 is a port in the serial interface device required to be tested. As previously discussed, the port under test 360 could be ports of USB 3.0 devices, ports of SATA devices, lanes of PCI Express devices, or any kind of ports/lanes of serial interface devices.

In this embodiment, assume a USB 3.0 device is going to be tested. Then, please refer to FIG. 4, the driving circuit 350 drives the pattern generator 310 to generate a first test pattern to test a port under test 360. After a few cycles, a test result pattern from the port under test 360 is gotten and stored in the elastic buffer 320. Then the symbol detector 330 detects whether there is a starting symbol within the test result pattern. If there is, the pattern generator 310 generates a second test pattern. In the present invention, the second test pattern is substantially identical to the first test pattern. Then, the comparison unit 340 compares the test result pattern and second test pattern to determine if the port under test 360 functions well.

In other words, no matter how many latencies of the port under test 360 has, the second test pattern is only generated while the starting symbol is detected from the test result pattern. As a result, it is not necessary to consider the issue of latency in the present invention. Furthermore, the counter 370 in the present invention counts how many different symbols exist between the second test pattern and the test result pattern within a predetermined time period. Therefore, bit error rate (BER) can be estimated.

In conclusion, as the abovementioned, when a starting symbol is detected, a second test pattern, identical to the first test pattern, is generated. Hence, the present invention can compensate loopback latency automatically and a device that stores test patterns of the first pattern generator is not required, and an error warning is greatly reduced. Furthermore, the present invention is capable of counting the error rate, therefore, the port under test can be analyzed more effectively.

In comparison to the prior art, the present invention does not consider the loopback latency and the present invention can reduce the effect of phase jitter and provides error rate count. Therefore, the present invention overcomes the defect of the prior art and hence the accuracy of the test is greatly increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test circuit receiving a first test pattern from a first pattern generator to test a lane under test, the test circuit comprising:
    a command symbol detector for detecting whether a command symbol is in a test result pattern, wherein the first test pattern is looped back through the lane under test to generate the test result pattern;
    a second pattern generator coupled to the command symbol detector for generating a second test pattern similar to the first test pattern when the command symbol is detected; and
    a logic unit coupled to the lane under test and the second pattern generator for comparing the test result pattern and the second test pattern.

2. The test circuit of claim 1, further comprising a counter coupled to the logic unit for counting a difference frequency between the test result pattern and the second test pattern.

3. The test circuit of claim 2, wherein the counter is further coupled to an error rate detecting circuit for figuring out a bit error rate (BER) of the lane under test according to the difference frequency.

4. The test circuit of claim 1, further comprising a test pattern selector for selecting different types of test patterns to execute different types of tests.

5. A test circuit receiving a first test pattern from a first pattern generator to test a lane under test, the test circuit comprising:
    a test unit for receiving a test result pattern generated by the lane under test according to the first test pattern;
    a detecting unit coupled to the test unit for detecting whether a command symbol is in the test result pattern; and
    a compare unit coupled to the test unit and the detecting unit;
    wherein when the detecting unit detects the command symbol within the test result pattern, the compare unit generates a second test pattern for being compared with the test result pattern, wherein the second test pattern is similar to the first test pattern.

6. The test circuit of claim 5, wherein the first test pattern is looped back through the lane under test to generate the test result pattern.

7. The test circuit of claim 5, wherein the test unit comprises an elastic buffer receiver coupled to the lane under test for receiving the test result pattern and outputting the test result pattern to the detecting unit and the compare unit.

8. The test circuit of claim 5, further comprising a test pattern selector coupled to the first pattern generator for selecting different test patterns to execute different types of tests.

9. The test circuit of claim 5, wherein the detecting unit comprises a command symbol detector for detecting whether the command symbol is in the test result pattern.

10. The test circuit of claim 9, wherein the detecting unit further comprises a drive circuit coupled to the command symbol detector for driving the compare unit to generate the second test pattern for being compared with the test result pattern when the command symbol is detected.

11. The test circuit of claim 5, wherein the compare unit further comprises:
    a second pattern generator coupled to the detecting unit for generating the second test pattern; and
    a logic unit coupled to the test unit, the detecting unit, and the second pattern generator for comparing the test result pattern and the second test pattern.

12. The test circuit of claim 11, further comprising a test pattern selector coupled to the second pattern generator for selecting different test pattern to execute different types of tests.

13. The test circuit of claim 5, further comprising a counter coupled to the compare unit for counting a difference frequency between the test result pattern and the second test pattern.

14. The test circuit of claim 13, further comprising an error rate detection circuit for figuring out a bit error rate (BER) of the lane under test according to the difference frequency.

15. A test method for testing a lane under test, the method comprising:
    utilizing a first test pattern to test the lane under test to generate a test result pattern according to the first test pattern;
    detecting whether a command symbol is in the test result pattern, wherein a second test pattern is generated similar to the first test pattern when the command symbol is detected; and
    comparing the test result pattern and the second test pattern.

16. The method of claim 15, further comprising counting a difference frequency between the test result pattern and the second test pattern.

17. The method of claim 16, further comprising figuring out a bit error rate (BER) of the lane under test according to the difference frequency.

18. The method of claim 15, wherein the first test pattern is looped back through the lane under test to generate the test result pattern.

19. The method of claim 15, wherein the first test pattern is received from a first pattern generator.

20. The method of claim 15, wherein the second test pattern is generated by a second pattern generator.

* * * * *